(12) United States Patent
Lai et al.

(10) Patent No.: US 8,404,538 B2
(45) Date of Patent: Mar. 26, 2013

(54) DEVICE WITH SELF ALIGNED STRESSOR AND METHOD OF MAKING SAME

(75) Inventors: Kao-Ting Lai, Hsinchu (TW); Da-Wen Lin, Hsinchu (TW); Hsien-Hsin Lin, Hsin-Chu (TW); Yuan-Ching Peng, Hsinchu (TW); Chi-Hsi Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 294 days.

(21) Appl. No.: 12/572,743

(22) Filed: Oct. 2, 2009

(65) Prior Publication Data

US 2011/0079820 A1   Apr. 7, 2011

(51) Int. Cl.
*H01L 21/8238* (2006.01)

(52) U.S. Cl. ........ 438/229; 438/275; 438/299; 438/300; 438/698; 438/760; 257/190; 257/327; 257/E21.619

(58) Field of Classification Search .................. None
See application file for complete search history.

(56) References Cited

U.S. PATENT DOCUMENTS

| | | | |
|---|---|---|---|
| 7,112,495 B2 * | 9/2006 | Ko et al. ............ | 438/300 |
| 7,358,551 B2 * | 4/2008 | Chidambarrao et al. ..... | 257/288 |
| 7,413,961 B2 | 8/2008 | Chong et al. | |
| 7,446,026 B2 | 11/2008 | Zhang et al. | |
| 7,494,884 B2 | 2/2009 | Lin et al. | |
| 7,619,285 B2 * | 11/2009 | Shin et al. ............ | 257/369 |
| 7,985,641 B2 * | 7/2011 | Kim et al. ............ | 438/199 |
| 8,222,673 B2 * | 7/2012 | Greene et al. ............ | 257/190 |
| 2005/0266631 A1 * | 12/2005 | Kim et al. ............ | 438/216 |
| 2007/0057287 A1 | 3/2007 | Lin et al. | |
| 2007/0132038 A1 | 6/2007 | Chong et al. | |
| 2007/0138570 A1 | 6/2007 | Chong et al. | |
| 2007/0152277 A1 | 7/2007 | Shima | |
| 2007/0173022 A1 | 7/2007 | Wang et al. | |
| 2007/0184601 A1 | 8/2007 | Zhang et al. | |
| 2007/0235802 A1 | 10/2007 | Chong et al. | |
| 2008/0006818 A1 | 1/2008 | Luo et al. | |
| 2008/0067557 A1 | 3/2008 | Yu et al. | |
| 2008/0083948 A1 | 4/2008 | Lin et al. | |
| 2008/0102573 A1 * | 5/2008 | Liang et al. ............ | 438/231 |
| 2008/0157200 A1 | 7/2008 | Kim et al. | |
| 2008/0265256 A1 | 10/2008 | Lin et al. | |
| 2008/0305621 A1 | 12/2008 | Dyer et al. | |
| 2009/0032880 A1 * | 2/2009 | Kawaguchi et al. ......... | 257/369 |
| 2009/0280579 A1 * | 11/2009 | Pal et al. ............ | 438/5 |

* cited by examiner

*Primary Examiner* — Evan Pert
*Assistant Examiner* — Andres Munoz
(74) *Attorney, Agent, or Firm* — Duane Morris LLP; Steven E. Koffs

(57) ABSTRACT

A method includes providing a substrate comprising a substrate material, a gate dielectric film above the substrate, and a first spacer adjacent the gate dielectric film. The spacer has a first portion in contact with a surface of the substrate and a second portion in contact with a side of the gate dielectric film. A recess is formed in a region of the substrate adjacent to the spacer. The recess is defined by a first sidewall of the substrate material. At least a portion of the first sidewall underlies at least a portion of the spacer. The substrate material beneath the first portion of the spacer is reflowed, so that a top portion of the first sidewall of the substrate material defining the recess is substantially aligned with a boundary between the gate dielectric film and the spacer. The recess is filled with a stressor material.

20 Claims, 5 Drawing Sheets

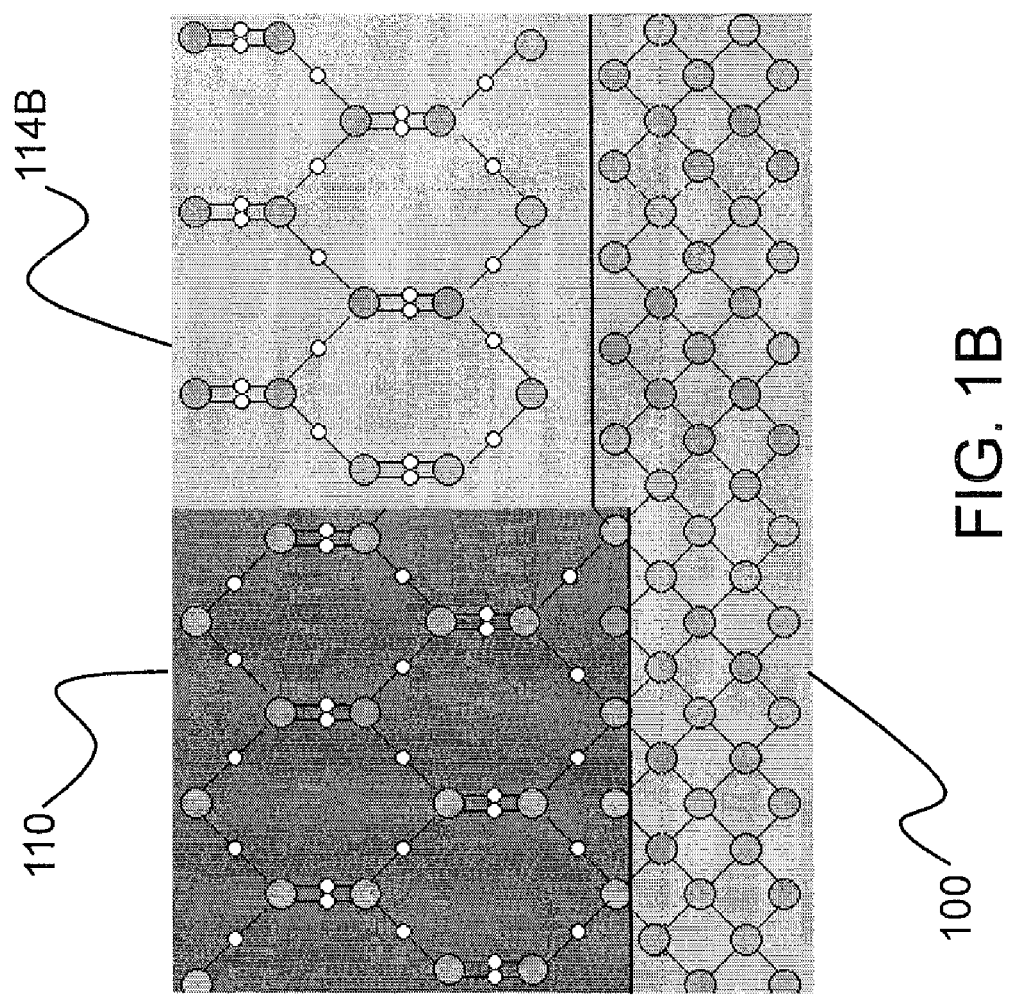

DEVICE WITH SELF ALIGNED STRESSOR AND METHOD OF MAKING SAME

FIELD OF THE INVENTION

The present disclosure relates to semiconductor fabrication generally, and more particularly to methods of making devices with stressors.

BACKGROUND

The continued development of metal-oxide-semiconductor field-effect transistors (MOSFET) has improved the speed, density, and cost per unit function of integrated circuits. One way to improve transistor performance is through selective application of stress to the transistor channel region. Stress distorts or strains the semiconductor crystal lattice, which affects the band alignment and charge transport properties of the semiconductor. By controlling the magnitude and distribution of stress in a finished device, manufacturers can increase carrier mobility and improve device performance. There are several existing approaches of introducing stress in the transistor channel region.

In U.S. Pat. No. 7,494,884, assigned to Taiwan Semiconductor Manufacturing Co., Ltd., MOS transistors have localized stressors for improving carrier mobility. A gate electrode is formed over a substrate. A carrier channel region is provided in the substrate under the gate electrode. Source/drain regions are provided on each side of the carrier channel region. The source/drain regions include an embedded stressor having a lattice spacing different from the substrate. The substrate is silicon and the embedded stressor is SiGe (for PMOS) or SiC (for NMOS). An epitaxy process that includes using HCl gas selectively forms a stressor layer within the crystalline source/drain regions and not on polycrystalline regions of the structure. In a PMOS transistor, the embedded SiGe stressor applies a compressive strain to channel region. In an NMOS transistor, the embedded stressor comprises SiC, and it applies a tensile strain to the transistor channel region.

The conventional process taught by U.S. Pat. No. 7,494,884 forms sidewall spacers on opposite sides of the gate electrode and gate dielectric. The sidewall spacers serve as self aligning masks for performing one or more ion implants within the source/drain regions. The embedded stressor regions are then positioned on either side of the sidewall spacers, and are thus separated from the channel.

An improved method for forming a device with an embedded stressor is desired.

SUMMARY OF THE INVENTION

In some embodiments, a method includes providing a substrate comprising a substrate material, a gate dielectric film above the substrate, and a first spacer adjacent to the gate dielectric film. The first spacer has a first portion in contact with a surface of the substrate and a second portion in contact with a side of the gate dielectric film. A recess is formed in a region of the substrate adjacent to the first spacer. The recess is defined by a first sidewall of the substrate material. At least a portion of the first sidewall underlies at least a portion of the first spacer. The substrate material beneath the first portion of the first spacer is reflowed, so that a top portion of the first sidewall of the substrate material defining the recess is substantially aligned with a boundary between the gate dielectric film and the first spacer. The recess is filled with a stressor material.

In some embodiments, a transistor includes a substrate comprising a substrate material, a gate dielectric film above the substrate, a gate above the gate dielectric film and first and second spacers adjacent to the gate dielectric film. The first spacer has a portion in contact with a first side of the gate dielectric film, and the second spacer has a portion in contact with a second side of the gate dielectric film. A source stressor region and a drain stressor region are provided in the substrate. The source stressor region has an edge substantially aligned with a boundary between the gate dielectric film and the first spacer. The drain stressor region has an edge substantially aligned with a boundary between the gate dielectric film and the second spacer. The source stressor region and drain stressor region are each filled with a stressor material that causes a stress in a channel between the source stressor region and drain stressor region.

BRIEF DESCRIPTION OF THE DRAWINGS

FIG. 1B is an enlarged detail of FIG. 1A.

DETAILED DESCRIPTION

Figure 1A:
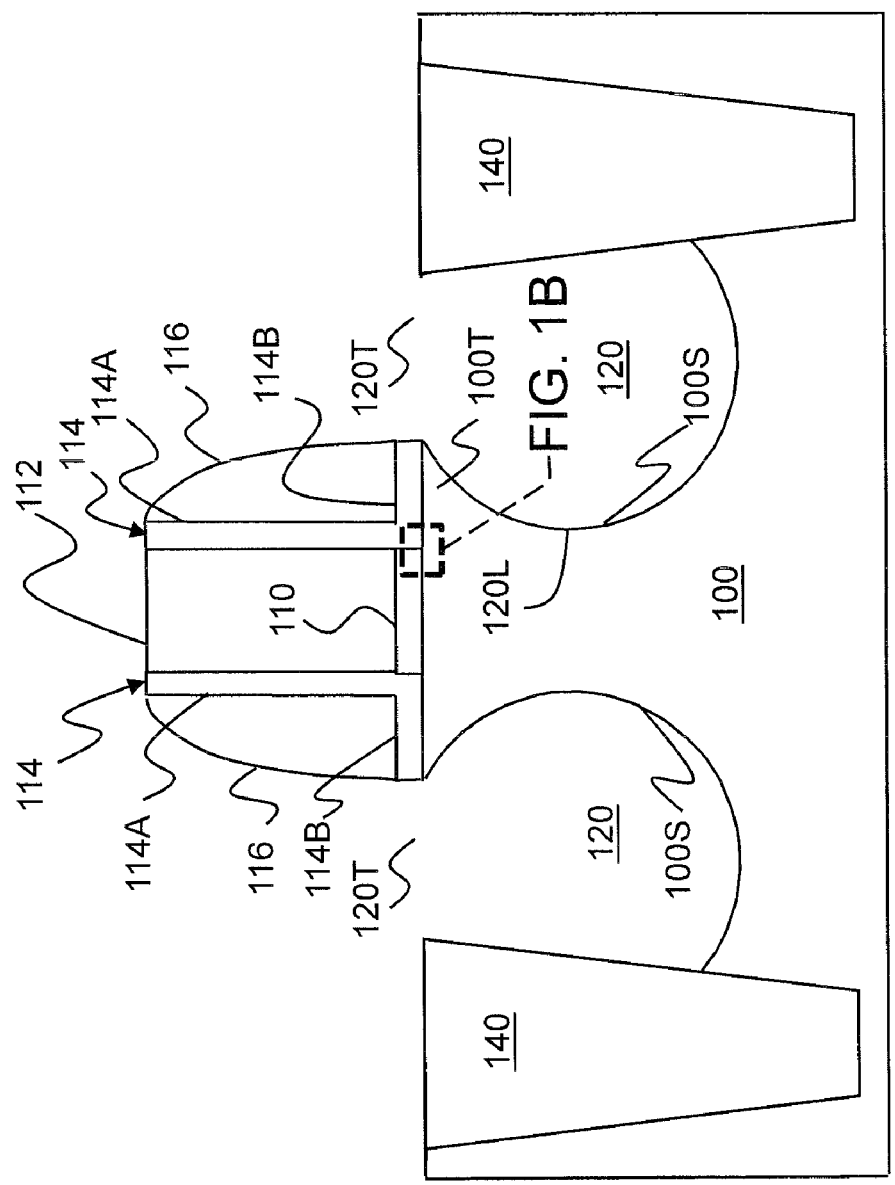
FIG. 1A shows an intermediate stage of forming a transistor, after formation of a recess. Only one side of the transistor is shown for brevity.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 4:
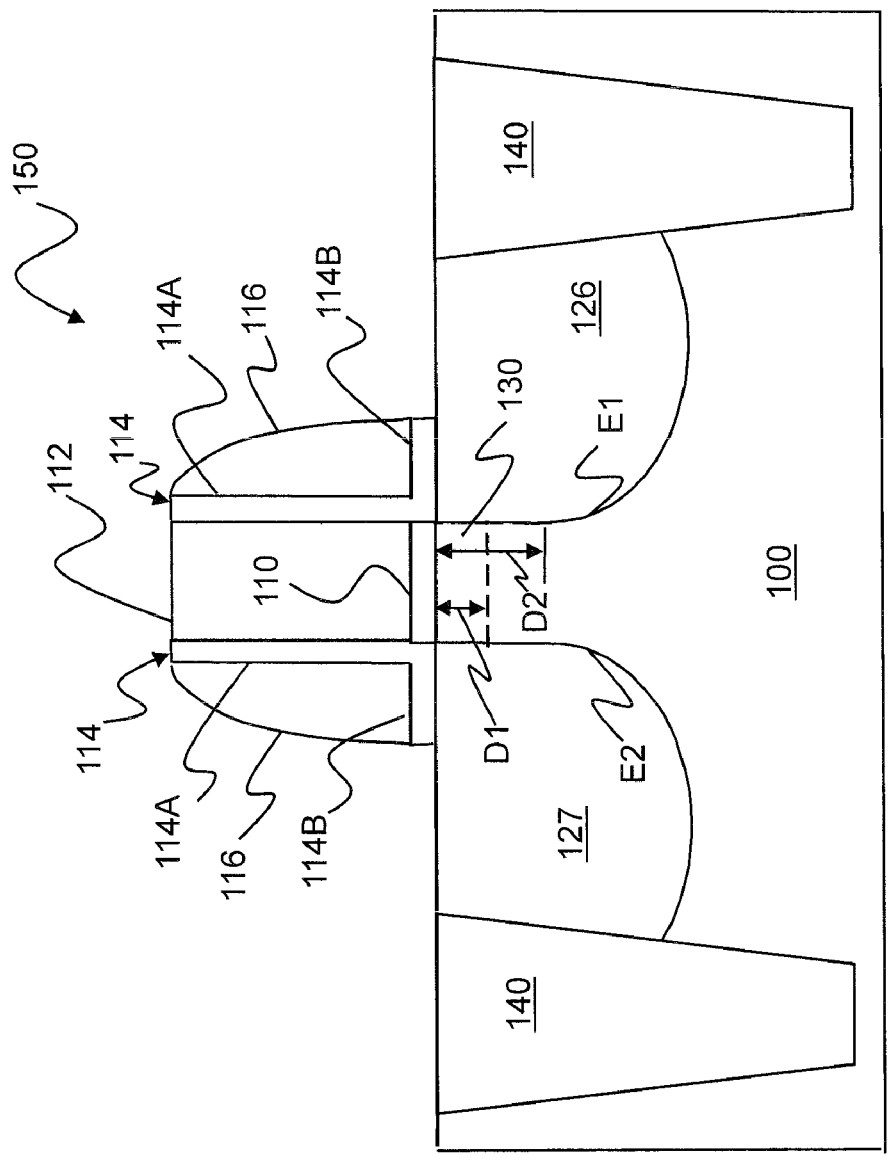
FIG. 4 shows the structure of FIG. 3, after filling the recesses with a stressor material. Both sides of the transistor are shown.

FIG. 4 shows a transistor 150 having self aligned stressor regions 126, 127 immediately adjacent to the channel 130 of the transistor, throughout the height D1 of the channel 130.

The transistor 150 includes a substrate 100 comprising a substrate material. In some embodiments, the substrate material is silicon. In other embodiments, the substrate 110 may comprise bulk silicon, doped or undoped, or an active layer of a silicon on insulator (SOI) substrate. Generally, an SOI substrate comprises a layer of a semiconductor material, such as silicon, or germanium, or silicon germanium (SGOI) formed on an insulator layer. The insulator layer may be, for example, a buried oxide (BOX) layer or a silicon oxide layer. The insulator layer is provided on a substrate, typically a silicon or glass substrate. Other substrates that may be used include multi-layered substrates, gradient substrates, or hybrid orientation substrates.

A gate dielectric film 110 is formed above the substrate 100. The gate dielectric film 110 may be formed of SiO, $SiO_2$, or any other suitable material (e.g., high-k dielectrics such as $Ta_2O_5$, $TiO_2$, $Al_2O_3$, $ZrO_2$, $HfO_2$, $Y_2O_3$, $L_2O_3$, and their aluminates and silicates, hafnium-based materials such as $HfO_2$, $HfSiO_x$, and $HfAlO_x$). In one embodiment, the gate dielectric 121 comprises an oxide layer, which may be formed by an oxidation process, such as wet or dry thermal oxidation in an ambient comprising an oxide, $H_2O$, NO, or a combination thereof.

A gate electrode 112 is formed above the gate dielectric film 110. The gate electrode 112 may be formed of Ta, Ti, Mo, W, Pt, Al, Hf, Ru, suicides or nitrides thereof doped polycrystalline silicon, other conductive materials, or a combination thereof, or other suitable conductive gate material. First and second spacers 114 are provided adjacent to the gate dielectric film 110, on each side thereof. The first spacer 114 has a portion 114A in contact with a first side of the gate dielectric film 110, and the second spacer 114 has a portion 114A in contact with a second side of the gate dielectric film. The sidewall spacers 114 serve as self aligning masks while performing ion implants within the source/drain regions, and allow formation of lightly doped drain (LDD) implants.

In some embodiments, the transistor 150 has L-shaped dummy spacers 114, each dummy spacer having a first portion 114A in contact with the gate dielectric film and a second portion 114B in contact with the source/drain regions 126. The dummy spacers 114 may be formed of a material such as SiO or TEOS, for example, and may have a thickness from about 20 Angstroms to about 200 Angstroms. Second spacers 116 are formed above the bottom portion 114B of each dummy spacer and adjacent to the first portions 114A. The second spacers 116 may be formed of $Si_3N_4$, $Si_xN_y$, $SiO_xN_y$, $SiO_xN_yH_z$, or SiO, for example, and may be between about 200 Angstroms and 700 Angstroms thick.

In other embodiments (not shown), the transistor may have a respective single unitary sidewall spacer on each side of the gate 112 and gate dielectric layer 110. Unitary sidewall spacers may be formed of $Si_3N_4$, $Si_xN_y$, $SiO_xN_y$, $SiO_xN_yH_z$, for example.

A curved, substantially U-shaped source stressor region 126 and a curved, substantially U-shaped drain stressor region 127 are formed in the substrate 100. One of ordinary skill in the art will understand that the depth of dopant implantation in the source and drain regions may differ from the depth of the stressor material in the regions 126 and 127, and that the transistor may include LDD implant regions beneath the spacers 114. The regions 126 and 127 in the drawings show the depth of the stressor material, and are not intended to illustrate dopant profiles.

The source stressor region 126 has an edge E1 substantially aligned with a boundary between the gate dielectric film 110 and the first spacer 114. The drain stressor region 127 has an edge E2 which is substantially straight and substantially aligned with a boundary between the gate dielectric film 110 and the second spacer 114. In some embodiments, the edges E1 and E2 are in line (along the same line or plane) with the boundary. In other embodiments, the edges E1 and E2 are parallel to the boundary, and offset from the boundary by only an insubstantial distance (e.g., 1 nanometer or less). The edges E1 and E2 have a depth D2 that is at least as large as the depth D1 of the channel region. In some embodiments, the depth D2 is between 2 and 3 times the depth D1. For example, in one embodiment, the channel depth D1 is 20 nanometers, and the straight, aligned edges E1 and E2 have a depth of 60 nanometers.

The source stressor region 126 and drain stressor region 127 are each filled with a stressor material that causes a stress in a channel between the source and drain regions. For a PMOS transistor, the stressor material is designed to place the channel region in compressive stress, so a material having a lattice larger than a lattice of silicon (e.g., SiGe) is used. For an NMOS transistor, the stressor material is designed to place the channel region in tensile stress, so a material having a lattice smaller than a lattice of silicon (e.g., SiC) is used. Thus, the stressor material in source/drain stressor regions 126, 127 is close to the transistor channel 130 along the complete height of the channel. This results in improved carrier mobility, and a lower parasitic resistance of a lightly doped drain (LDD) region (not shown) to be formed beneath the spacer's sidewall 114. In a test comparing a transistor with self aligned stressors as shown in FIG. 4 to a transistor with the stressors separated from the channel by the sidewall spacers, the device of FIG. 4 had a performance improvement of 10% (as determined by Ioff/Idsat), and Rsd was reduced by 15%.

The transistor 150 is located between a pair of field oxide (FOX) or shallow trench isolation (STI) regions 140. Techniques for forming a FOX or STI region are known in the art. Any suitable technique may be used for forming the FOX or STI regions 140.

Figure 3:
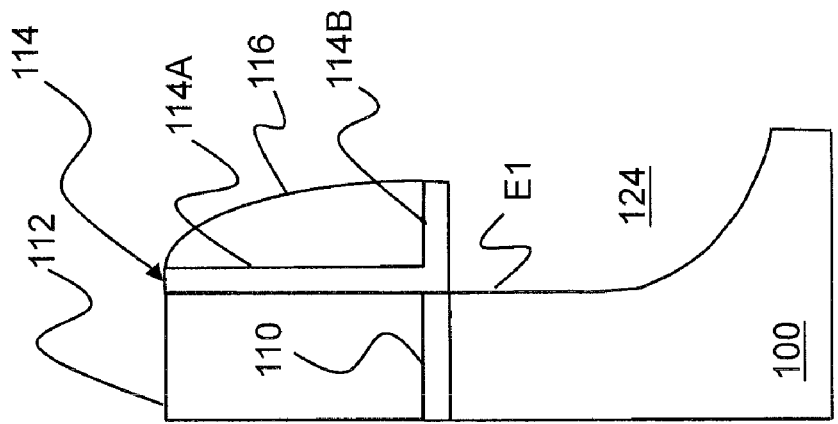
FIG. 3 shows the structure of FIG. 2 after completion of baking
Figure 2:
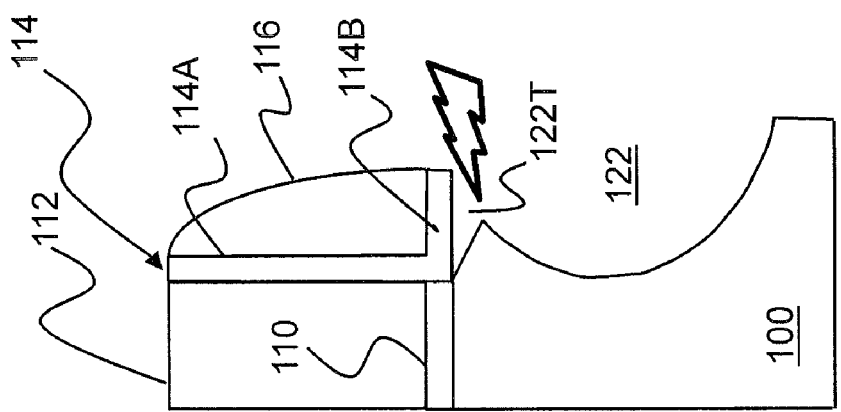
FIG. 2 shows the structure of FIG. 1A, during baking.
Figure 5:
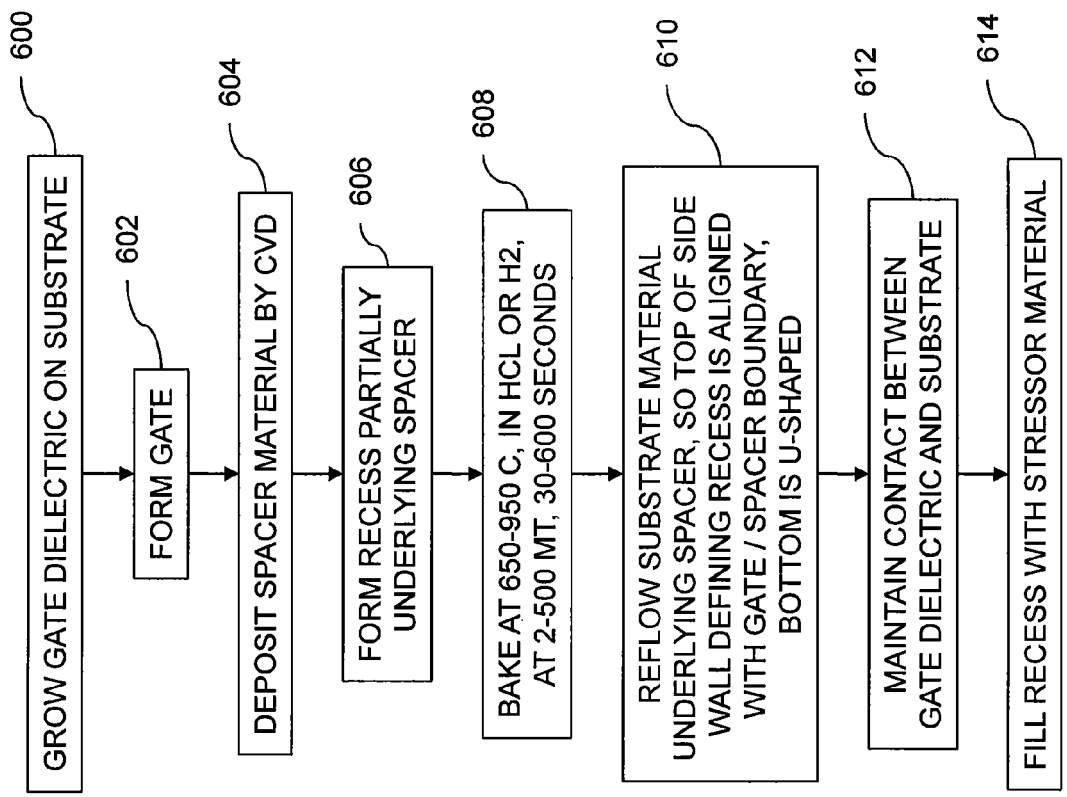
FIG. 5 is a flow chart of an exemplary process.

FIG. 5 is a flow chart of an exemplary process, and FIGS. 1-3 show a cross section of one side of the transistor during the process.

At step 600 of FIG. 5, the gate dielectric film 110 is grown on the substrate 100, or otherwise formed on the substrate in a process that forms a relatively strong bond (such as, but not limited to, a covalent bond) between the gate dielectric material 110 and the underlying substrate material 100.

At step 602, the gate electrode 112 is formed on the gate dielectric film 110. For example, in a typical process, after depositing the gate dielectric film layer, a layer of conductive gate material 112 (e.g., metal for an NMOS gate, or polysilicon for a PMOS gate) is deposited over the gate dielectric layer 110, and an anisotropic etch, such as a dry etch, is performed.

At step 604, the spacer material for dummy spacers 114 (or unitary spacers, not shown) is deposited by a process that forms a relatively weak bond between the material of spacer portion 114B and the underlying substrate material 100. That is, the bond between gate dielectric 110 and substrate 100 is stronger than the bond between the spacer material of spacer 114 and the substrate 100. For example, a conformal layer of dummy spacer material for may be deposited over the gate 112 and adjacent regions by a chemical vapor deposition (CVD) process, so that the bond between spacers 114 and substrate 100 is provided by van der Waals force, or by other adhesion mechanism weaker than the particular bond between the gate dielectric film 110 and the substrate 100. FIG. 1B shows the respective covalent bonds of the gate dielectric layer 110 and weak bond of the dummy spacer 114.

After depositing the layer of material for the dummy spacers 114, the conformal layer of material for the second spacers 116 is deposited. Subsequent anisotropic etching removes the dummy spacer material layer and second spacer material layer, except in the regions immediately adjacent to the gate dielectric layer 110 and gate electrode 112, so as to form the dummy spacers 114 and spacers 116.

In other embodiments (not shown), where unitary spacers are provided, a single thicker conformal layer of the spacer material is deposited over the gate and adjacent regions, and the anisotropic etch is performed, so that spacer material only remains adjacent to the gate dielectric film 110 and gate electrode 112.

Depending on the specific process flow, the FOX or STI regions 140 may be formed at this time. In other embodiments, the FOX or STI regions 140 are formed after step 614.

At step 606, a recess 120 is formed in a region of the substrate 100 adjacent to the first spacers 114 on each side of the gate (only one side shown in FIGS. 1-3). Each recess 120 is defined by a first sidewall 100S of the substrate material 100. At least a portion 100T of the first sidewall 100S underlies at least a portion of the first spacer 114. The recesses 120 may be formed by an isotropic process. For example, a dry isotropic etch or a dry etch plus a wet etch may be performed. At this point, the substrate 100 appears as shown in FIG. 1A. Each recess has a top portion 120T at the surface of the substrate 100 and a lower portion 120L, the top portion being narrower than the lower portion. Each recess 120 has an undercut, so that the lower portion 120L of the recess extends under the spacers 114, while the top 120T of the recess stops at the end of the spacers 114 remote from the gate dielectric 110.

Also, as shown in FIG. 1A, at this point in the process, the substrate material 100 contacts an entire bottom surface of the first spacer 114 and an entire bottom surface of the second spacer 114.

At step 608, the substrate material is reflowed beneath the bottom portion 114B of the first spacer 114. For example, the substrate 100 may be baked at 650 to 950 degrees Celsius, in an atmosphere of hydrogen ($H_2$) or hydrochloric acid (HCl), at a pressure between 2 and 500 milliTorr, for a period between 30 seconds and 10 minutes. One of ordinary skill can readily adjust any of the three baking parameters (temperature, pressure and time) to accommodate the specific values of the other two parameters selected. As shown in FIG. 2, the baking step 608 reflows the substrate material, and releases the silicon beneath the dummy spacers 114, to form a modified recess 122. However, the strong (e.g., covalent) bond between the gate dielectric material 110 and the substrate 100 is not overcome, so that the silicon is pinned at the boundary between the gate dielectric material 110 and the dummy spacer 114.

At step 610, the reflowing continues until the surface energy of the substrate material 100 migrates to a lower energy state, and the top of the side wall defining each recess is aligned with the boundary between the gate 112 and the spacer 114. FIG. 3 shows the substrate 100 at the completion of step 610. The material of substrate 100 beneath the spacers 114 has completely flowed downwards towards the bottom of the recess (now labeled 124), so that the recess has a curved, substantially U-shaped or J-shaped profile. As shown in FIG. 3, a top portion of the first sidewall of the substrate material defining the recess is substantially straight and aligned. The substrate material 100 is absent from substantially the entire bottom surface of the first spacer 114 and substantially the entire bottom surface of the second spacer 114.

At step 612, throughout the reflowing of substrate material 100 beneath the spacers 114, contact is maintained between the gate dielectric layer 110 and the material of substrate 100.

At step 614, the recess is filled with the stressor material (e.g., SiGe for a PMOS or SiC for an NMOS), to form the structure shown in FIG. 4.

Using a process as described above, the stressors can be self-aligned with the boundary between the gate and sidewall spacers, without requiring any additional photomasks.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising:
   providing a substrate comprising a substrate material, a gate dielectric film above the substrate, and a first spacer adjacent to the gate dielectric film, the first spacer having an L-shape including a horizontal first portion in contact with a surface of the substrate and a vertical second portion in contact with a side of the gate dielectric film, wherein the horizontal first portion extends away from the gate dielectric film beyond a side edge of the vertical second portion opposite the gate dielectric film;
   forming a recess in a region of the substrate adjacent to the first spacer, the recess defined by a first sidewall of the substrate material, at least a portion of the first sidewall underlying and contacting at least the horizontal first portion of the first spacer extending beyond the side edge of the vertical second portion opposite the gate dielectric film;
   reflowing the substrate material beneath the horizontal first portion of the first spacer extending beyond the side edge of the vertical second portion opposite the gate dielectric film while the horizontal first portion is in place, so that a top portion of the first sidewall of the substrate material defining the recess is substantially aligned with a boundary between the gate dielectric film and the first spacer; and
   filling the recess with a stressor material, so that the stressor material has a flat top surface contacting an entire bottom surface of the horizontal first portion.

2. The method of claim 1, wherein the reflowing step includes maintaining the substrate material underlying the gate dielectric film in contact with the gate dielectric film.

3. The method of claim 1, wherein the providing step includes forming the gate dielectric film and the first spacer to provide a first bond between the gate dielectric film and the substrate material that is stronger than a second bond between the first spacer and the substrate material.

4. The method of claim 3, wherein the first bond is a covalent bond, and the second bond is provided by van der Waals force.

5. The method of claim 3, wherein the providing step includes growing the gate dielectric film on the substrate and depositing the first spacer on the substrate.

6. The method of claim 1, wherein the reflowing step includes baking the substrate at a temperature from about 650 degrees C. to about 950 degrees C., in a gas environment containing $H_2$ or HCl at a pressure from 2 mT to 500 mT, for a period between 30 seconds and 10 minutes.

7. The method of claim 1, wherein the forming step includes forming the recess by an isotropic etching step, such that prior to the reflowing step, the substrate material contacts an entire bottom surface of the horizontal first portion of the first spacer, and after the reflowing step, the substrate material is absent from substantially the entire bottom surface of the horizontal first portion of the first spacer.

8. The method of claim 7, wherein:
   a second spacer is provided adjacent to the gate dielectric film on a side opposite the first spacer, the second spacer having a portion in contact with the surface of the substrate and a portion in contact with the side of the gate dielectric film opposite the first spacer;
   prior to the reflowing step, a second recess is provided partly beneath the second spacer and partly beneath a region adjacent to the second spacer; and
   the reflowing step includes reflowing the substrate material beneath the second spacer, so that a top portion of a second sidewall of the substrate material defining the second recess is substantially aligned with a boundary between the gate dielectric film and the second spacer, and the second recess has a curved bottom portion.

9. The method of claim 8, wherein prior to the reflowing step, the substrate material contacts an entire bottom surface of the second spacer, and after the reflowing step, the substrate material is absent from substantially the entire bottom surface of the second spacer.

10. The method of claim 1, wherein the top portion of the first sidewall of the substrate material is substantially straight after the reflowing step.

11. The method of claim 1, wherein a bottom portion of the recess is curved, and U-shaped or J-shaped.

12. The method of claim 11, wherein prior to the reflowing step, the recess has a top portion at the surface of the substrate and a lower portion, the top portion being narrower than the lower portion.

13. The method of claim 11, wherein the top portion of the recess has a substantially straight side extending deeper than a channel portion underlying the gate dielectric film.

14. The method of claim 1, wherein the substrate has a gate electrode on the gate dielectric film, the method further comprising forming the L-shape by:
    depositing a conformal film that covers a vertical side wall of the gate electrode and a horizontal surface of a region of the substrate where a lightly doped drain is to be formed; and
    removing the conformal film, except in regions immediately adjacent to the gate dielectric layer and the gate electrode.

15. The method of claim 1, wherein the reflowing step includes reflowing the substrate material beneath the horizontal first portion of the first spacer to flow downwards towards a bottom of the recess.

16. The method of claim 1, wherein the flat top surface of the stressor material extends from the first sidewall of the substrate material to an isolation region, and the horizontal first portion of the spacer extends only partially between the second vertical portion and the isolation region.

17. The method of claim 16, wherein:
    the horizontal and vertical portions are made of the same material as each other,
    the recess is formed by isotropic etching; and
    the reflowing step reflows the substrate material beneath the vertical second portion of the first spacer.

18. A method comprising:
    providing a substrate comprising a substrate material, a gate dielectric film above the substrate, and a first spacer adjacent to the gate dielectric film, the first spacer having an L-shape including an elongated horizontal first portion in contact with a surface of the substrate and a vertical second portion in contact with a side of the gate dielectric film, the vertical second portion formed of the same material as the elongated horizontal first portion, the elongated horizontal first portion extending away from the gate dielectric film beyond a side edge of the vertical second portion opposite the gate dielectric film and having a horizontal length substantially greater than a thickness of the first spacer;
    forming a recess in a region of the substrate adjacent to the first spacer, the recess defined by a curved first sidewall of the substrate material, so that a lower portion of the recess extends under the elongated horizontal first portion of the first spacer, with a horizontally extending top portion of the curved first sidewall underlying and directly contacting at least a portion of the elongated horizontal first portion extending beyond the side edge of the vertical second portion opposite the gate dielectric film, while a top of the recess stops at an end of the elongated horizontal first portion away from the gate dielectric film;
    reflowing the substrate material beneath the elongated horizontal first portion of the first spacer extending beyond the side edge of the vertical second portion opposite the gate dielectric film while the horizontal first portion is in place extending beyond the side edge, so that a top portion of the curved first sidewall of the substrate material defining the recess is substantially aligned with a boundary between the gate dielectric film and the first spacer; and
    filling the recess with a stressor material, so that the stressor material has a flat top surface contacting an entire bottom surface of the elongated horizontal first portion.

19. The method of claim 18, wherein:
    the providing step includes forming the gate dielectric film and the first spacer to provide a first bond between the gate dielectric film and the substrate material that is stronger than a second bond between the first spacer and the substrate material, where the first bond is a covalent bond, and the second bond is provided by van der Waals force;
    the providing step includes growing the gate dielectric film on the substrate and depositing the first spacer on the substrate, where the step of depositing the first spacer includes a chemical vapor deposition step;
    the forming step includes forming the recess by an isotropic etching step;
    the reflowing step includes maintaining the substrate material underlying the gate dielectric film in contact with the gate dielectric film;
    the reflowing step includes baking the substrate at a temperature from about 650 degrees C. to about 950 degrees C., in a gas environment containing $H_2$ or HCl at a pressure from 2 mT to 500 mT, for a period between 30 seconds and 10 minutes;
    the top portion of the curved first sidewall of the substrate material is substantially straight after the reflowing step;
    a bottom portion of the recess is curved and U-shaped; and
    prior to the reflowing step, the substrate material contacts an entire bottom surface of the first spacer and an entire bottom surface of a second spacer, and after the reflowing step, the substrate material is absent from substantially the entire bottom surface of the first spacer and substantially the entire bottom surface of the second spacer, and the flat top surface of the stressor material extends from the curved first sidewall of the substrate material to an isolation region.

20. A method comprising:
    providing a substrate comprising a substrate material, a gate dielectric film above the substrate, and a first spacer adjacent to the gate dielectric film, the first spacer having an L-shape and including a horizontal first film in contact with a surface of the substrate and a vertical second film in contact with a side of the gate dielectric film, wherein the horizontal first film has a horizontal length substantially greater than a thickness of the first spacer and extends away from the gate dielectric film beyond a side edge of the vertical second film opposite the gate dielectric film;
    forming a recess in a region of the substrate adjacent to the first spacer, the recess defined by a first sidewall of the substrate material, at least a top portion of the first sidewall extending horizontally to underlie and directly contact the entire horizontal first film of the first spacer extending beyond the side edge of the vertical second portion opposite the gate dielectric film;

reflowing the substrate material beneath the horizontal first film of the first spacer extending beyond the side edge of the vertical second film opposite the gate dielectric film while the horizontal first portion is in place extending beyond the side edge, to flow downwards towards a bottom of the recess, so that a top portion of the first sidewall of the substrate material defining the recess is substantially aligned with a boundary between the gate dielectric film and the first spacer; and filling the recess with a stressor material, so that the stressor material has a flat top surface contacting an entire bottom surface of the horizontal first film.

* * * * *

UNITED STATES PATENT AND TRADEMARK OFFICE
CERTIFICATE OF CORRECTION

| | | |
|---|---|---|
| PATENT NO. | : 8,404,538 B2 | Page 1 of 1 |
| APPLICATION NO. | : 12/572743 | |
| DATED | : March 26, 2013 | |
| INVENTOR(S) | : Kuo-Ting Lai et al. | |

It is certified that error appears in the above-identified patent and that said Letters Patent is hereby corrected as shown below:

In the Claims:

Claim 6, Column 6, Line 41, remove both occurrences of "C." and insert -- C --.

Signed and Sealed this
Twelfth Day of November, 2013

Teresa Stanek Rea
*Deputy Director of the United States Patent and Trademark Office*